United States Patent
Blumenthal et al.

(10) Patent No.: US 8,626,253 B2
(45) Date of Patent: Jan. 7, 2014

(54) ELECTRICALLY CONDUCTIVE SHIELD FOR SUPERCONDUCTING ELECTROMAGNET SYSTEM

(75) Inventors: Mark Blumenthal, Cape Town (ZA); Marcel Jan Marie Kruip, Oxford (GB)

(73) Assignee: Siemens PLC., Frimley, Camberley, Surrey (GB)

( * ) Notice: Subject to any disclaimer, the term of this patent is extended or adjusted under 35 U.S.C. 154(b) by 166 days.

(21) Appl. No.: 13/349,867

(22) Filed: Jan. 13, 2012

(65) Prior Publication Data

US 2012/0184444 A1 Jul. 19, 2012

(30) Foreign Application Priority Data

Jan. 13, 2011 (GB) .................................. 1100535.2

(51) Int. Cl.
*G01R 33/035* (2006.01)
(52) U.S. Cl.
USPC ........................................................ 505/162
(58) Field of Classification Search
USPC .................. 505/162–163, 211, 842–843, 879
See application file for complete search history.

(56) References Cited

U.S. PATENT DOCUMENTS

| 6,326,788 | B1 * | 12/2001 | Mulder et al. ................ 324/318 |
| 6,552,543 | B1 * | 4/2003 | Dietz ............................. 324/318 |
| 7,375,526 | B2 * | 5/2008 | Edelstein et al. ............. 324/318 |
| 7,514,928 | B2 | 4/2009 | Westphal |
| 2008/0094062 | A1 | 4/2008 | Edelstein et al. |

FOREIGN PATENT DOCUMENTS

| GB | 2 355 537 A | 4/2001 |
| GB | 2465991 A | 6/2010 |
| WO | 00/25146 A1 | 5/2000 |

\* cited by examiner

*Primary Examiner* — Colleen Dunn
(74) *Attorney, Agent, or Firm* — Schiff Hardin LLP

(57) ABSTRACT

In a superconducting electromagnet system or method, cryogenically cooled magnet coils are arranged to provide a static magnetic field in an imaging region. A gradient coil assembly is arranged to provide oscillating magnetic fields within the imaging region. An electrically conductive shield is positioned between the cryogenically cooled magnet coils and the gradient coil assembly. The cryogenically cooled magnet coils are located within an outer vacuum chamber, and the electrically conductive shield is positioned outside the outer vacuum chamber between a surface of the outer vacuum chamber and the gradient coil assembly and inside a bore tube of the outer vacuum chamber. The conductive shield is supported on resilient damping mounts between the conductive shield and the gradient coil assembly and between the conductive shield and the bore tube of the outer vacuum chamber.

32 Claims, 6 Drawing Sheets

Table 1

| | f(kHz) | CT | NCT | k | |
|---|---|---|---|---|---|
| RT 1μs | 1 | 0.024 4 | 0.188 31 | 7.8 | ΔT (K) P (mW) |
| | 1.33 | 0.291 48 | 3 500 | 10.4 | ΔT (K) P (mW) |
| | 4 | 1.775 296 | 28 4625 | 15.6 | ΔT (K) P (mW) |
| RT 100μs | 1 | | 0.125 21 | | ΔT (K) P (mW) |
| | 1.33 | 0.11 18 | 1.919 320 | 17.8 | ΔT (K) P (mW) |
| | 4 | 1.149 191 | 18.4 3075 | 16.1 | ΔT (K) P (mW) |

ELECTRICALLY CONDUCTIVE SHIELD FOR SUPERCONDUCTING ELECTROMAGNET SYSTEM

BACKGROUND

The present preferred embodiment relates to magnetic resonance imaging (MRI) systems, which employ a cryogenically cooled superconducting magnet and active gradient magnet coils. In particular, the preferred embodiment relates to such MRI systems in which the superconducting magnet is cooled by conduction cooling to a cryogenic refrigerator, or where a cooling loop system, or other low-cryogen-volume cooling system is in use. The embodiment may, however, be usefully applied also to superconducting magnets which are cooled by partial immersion in a bath of cryogen.

FIG. 1 shows a schematic axial part-cross-section through components of a cylindrical superconducting magnet in an MRI system suitable for improvement by application of the present preferred embodiment. The illustrated structure is essentially rotationally symmetrical about axis A-A. Annular superconducting coils 10 are thermally attached to a cooling loop pipe 12 through a crust layer 14. Each cooling loop pipe 14 includes a bore 16 arranged to carry liquid and/or gaseous cryogen in a circulating fashion to a cryogenic refrigerator, thereby maintaining coils 10 at an operating temperature below their superconducting transition temperature. In this example, the circulating cryogen is helium. A mechanical retaining structure 18 is provided, to support the magnet. As shown, this is typically also cooled by the cooling loop pipe. The superconducting magnet and other cooled components are enclosed within an outer vacuum chamber (OVC) 20, which is only partially represented in the drawing. The OVC and thermal radiation shields, together with associated components not illustrated, make up a cryostat for holding the magnet at a cryogenic temperature.

The OVC is at ambient temperature, and one or two thermal radiation shields 22, 24 may be provided between the magnet and the OVC, to intercept thermal radiation from the OVC before it reaches the magnet. In the illustrated example, two thermal radiation shields are provided. An outer thermal radiation shield 24 is cooled to a temperature of for example about 77K. This may be achieved by cooling by boiling of a sacrificial liquid nitrogen cryogen, or by operation of a mechanical refrigerator. Thermal radiation from the OVC, typically at a temperature of about 300K, is intercepted by this outer thermal radiation shield and is removed from the system by cooling of the outer thermal radiation shield. An inner thermal radiation shield 22 is cooled to about 4K by the cooling loop tube 12. In the illustrated arrangement, this is achieved by thermal conduction from the inner thermal radiation shield through shield support structure 26 and mechanical retaining structure 18.

As the magnet is itself cylindrical, a cylindrical bore 30, aligned to axis A-A extends through the magnet system, and allows access for a patient to be imaged. Typically, an imaging region is present at the axial mid-point of the bore, is essentially spherical and has a diameter of about 40-50 cm.

Within the bore of the OVC 20, a gradient coil assembly 32 is positioned. As is well known, such gradient coil assembly provides oscillating magnetic fields in orthogonal directions in the imaging region, as required in forming MRI images. These oscillating fields typically operate at a frequency from 1 Hz to 4 kHz.

In operation, the oscillating magnetic fields of the gradient coil assembly do not only extend into the imaging region, but stray magnetic fields from the gradient coil assembly reach the OVC.

The time-varying stray magnetic fields of the gradient coils 32 will induce appreciable Ohmic heating effects in both the thermal radiation shield(s) 22, 24 and in the superconducting coils 10 of the magnet system.

Typically, the stray time-varying magnetic fields from the gradient coil assembly will, directly or indirectly, induce eddy currents in metal parts of the cryostat, in particular metal bore tubes of the OVC 20 and the thermal shield(s) 22, 24. The structure of the OVC, if of metal, will provide shielding to the superconducting coils and the thermal radiation shield(s) 22, 24 from the stray magnetic fields from the gradient coil assembly 32. However, due to the static background magnetic field produced by the magnet coils 10, the eddy currents induced in the material of the OVC by the time-varying magnetic fields from the gradient coils produce Lorentz forces, resulting in mechanical vibrations of the OVC. These vibrations, which occur within the static magnetic field of the magnet coils 10, will in turn generate eddy currents in the material of the OVC which in turn produce secondary stray fields. These secondary stray fields can be much larger than the original stray fields produced by the gradient coils. The mechanical vibrations of the OVC will be particularly strong when a resonance vibration mode of the OVC bore tube is excited. Similarly, tertiary and further stray fields may be generated, effectively passing through the thermal radiation shield(s) 22, 24 to interact directly with the superconducting coils.

If resonant vibration modes and frequencies of the bore tubes of OVC 20 and thermal shield(s) 22, 24 are close together, as common in present magnet systems, the bore tubes behave as a chain of closely coupled oscillators, and resonance bands will occur. Eddy currents induced in the superconducting magnet coils from the time-varying magnetic field induced from the mechanically vibrating conducting surfaces as discussed above constitute a heat-load on the cooling system. This excess heat-load can result in a temperature rise of the coils, which can lead to a quench in the superconducting coils. Even with magnets which are cooled by partial immersion in a cryogen, the heat-load will cause an increase in cryogen consumption and/or an increase in power consumed by the cryogenic refrigerator.

SUMMARY

It is an object to reduce such propagation of time-varying magnetic fields to the magnet coils 10 and cryogenically cooled structure 18, 26, 22 of a superconducting magnet system for use in MRI imaging.

In a superconducting electromagnet system or method, cryogenically cooled magnet coils are arranged to provide a static magnetic field in an imaging region. A gradient coil assembly is arranged to provide oscillating magnetic fields within the imaging region. An electrically conductive shield is positioned between the cryogenically cooled magnet coils and the gradient coil assembly. The cryogenically cooled magnet coils are located within an outer vacuum chamber, and the electrically conductive shield is positioned outside the outer vacuum chamber between a surface of the outer vacuum chamber and the gradient coil assembly and inside a bore tube of the outer vacuum chamber. The conductive shield is supported on resilient damping mounts between the conductive shield and the gradient coil assembly and between the conductive shield and the bore tube of the outer vacuum chamber.

DESCRIPTION OF EXEMPLARY PREFERRED EMBODIMENTS

Figure 1:
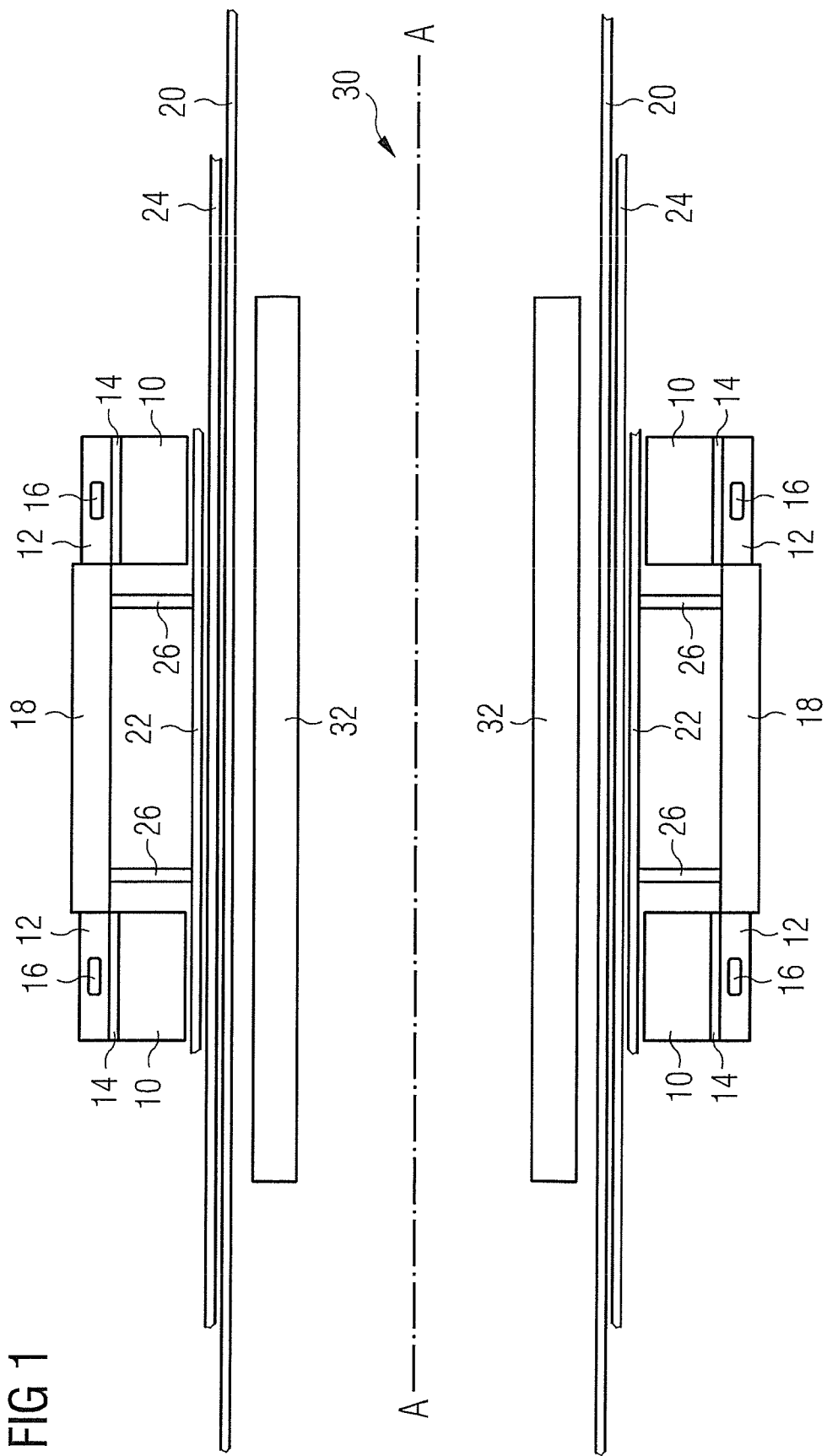
FIG. 1 shows a schematic axial part-cross-section through components of a cylindrical superconducting magnet in an MRI system suitable for improvement by application of the present exemplary embodiment.

For the purposes of promoting an understanding of the principles of the invention, reference will now be made to the preferred exemplary embodiments/best mode illustrated in the drawings and specific language will be used to describe the same. It will nevertheless be understood that no limitation of the scope of the invention is thereby intended, and such alterations an further modifications in the illustrated embodiments and such further applications of the principles of the invention as illustrated as would normally occur to one skilled in the art to which the invention relates are included.

The present preferred exemplary embodiment addresses the above problems by providing an additional electrically conductive shield in the bore of the magnet and thus reducing the power dissipation in other parts of the system.

U.S. Pat. Nos. 7,514,928 and 6,707,302 describe methods of reducing gradient induced heating effects with metal tubes, but do not detail the advantages or otherwise of constraining, or partially constraining such a tube.

Although the provision of additional shields for this purpose has been attempted before, such additional tubes have been mechanically rigidly attached to the OVC and thermal radiation shield(s). The present exemplary embodiment provides an electrically conductive shield tube which is mechanically decoupled from the gradient coil and OVC by ensuring the tube is unconstrained.

The above, and further, objects, characteristics and advantages of the present exemplary embodiments will become more apparent from the following description of that embodiment, given by way of non-limiting examples, in conjunction with the accompanying drawings.

According to the present preferred embodiment, a total power dissipated in the inner thermal shield 22 and the superconducting coils 10 decreases in response to the inclusion of a tube made of a relatively highly conductive metal. This tube is mechanically free to vibrate—to a certain extent—for example by mounting on resilient mounts, rather than rigid mechanical mounts.

Figure 2:
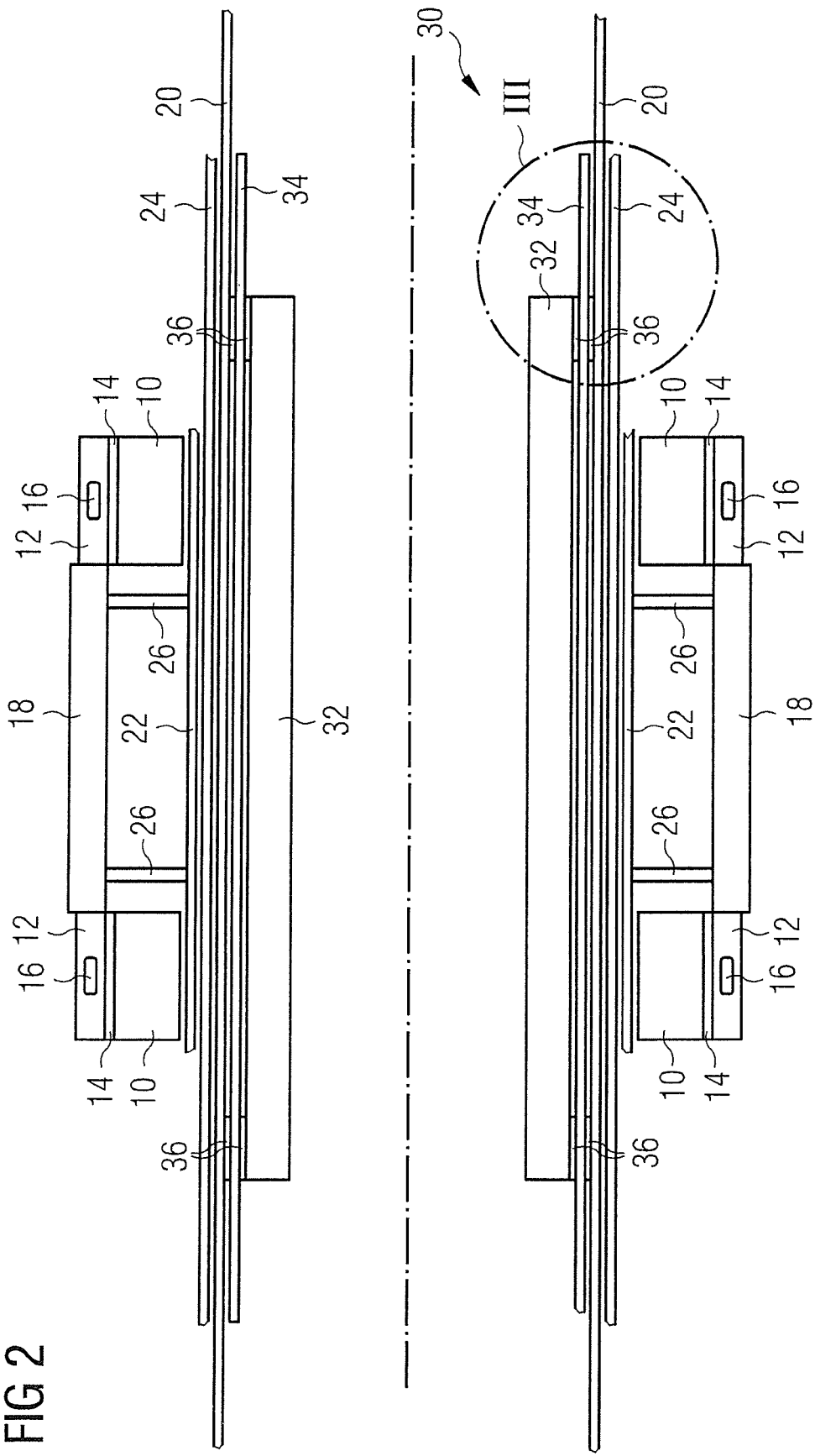
FIG. 2 shows a schematic axial part-cross-section of the MRI system of FIG. 1, improved according to one exemplary embodiment of the present invention.

According to the present exemplary embodiment illustrated in FIG. 2, a conductive shield 34, in this case in the form of a cylindrical tube, is provided between the magnet coils 10 and the gradient coil assembly 32. In the illustrated example, the conductive shield 34 is located between the gradient coil assembly 32 and the bore tube of the OVC 20. In other embodiments, discussed below, the conductive shield may be positioned in other locations.

In a preferred exemplary embodiment, the conductive shield 34 is a copper tube. Other electrically conductive materials may be used. Copper is a suitable material as it has a very high electrical conductivity, and a high density, which tends to damp mechanical oscillations. A copper tube has a rather different mechanical resonance frequency than tubes of similar dimensions constructed out of aluminium or stainless steel, being materials commonly used for bore tubes of OVCs and thermal radiation shields. This reduces the tendency of the conductive shield of the exemplary embodiment to act as a coupled resonator with the bore tubes of the OVC and the thermal radiation shield(s).

In particularly preferred embodiments, the conductive shield is a copper tube having a material thickness of 2 mm or more.

According to a feature of the present preferred embodiment, the conductive shield 34 is resiliently mounted in place, rather than being mechanically rigidly mounted. As illustrated in the example of FIG. 2, this may be achieved by inserting pads 36, made of a compliant material and resilient material, such the range of cellular polyurethane elastomers sold under the trademark SYLOMER® and available from A. Proctor Group Ltd., between the conductive shield 34 and the OVC 20, and between the conductive shield 34 and the gradient coil 32. Of the SYLOMER® range, SYLOMER® Pink and SYLOMER® LT may be found particularly appropriate.

Figure 3:
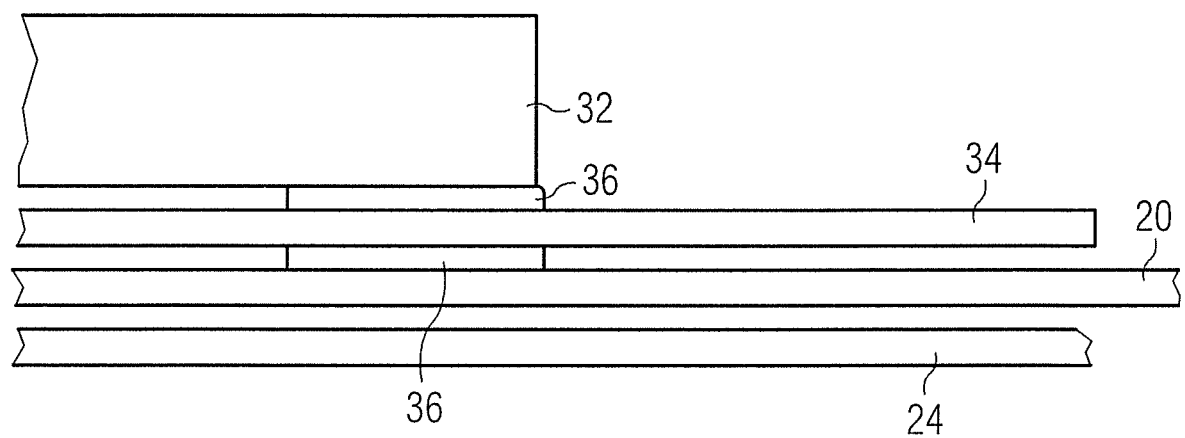
FIG. 3 shows an enlargement of the part III of FIG. 2.

FIG. 3 shows an enlargement of the part III of FIG. 2.

The resilient pads 36 provide a mechanically resilient, damping mounting structure for the conductive shield 34.

In this illustrated embodiment, the conductive shield 34 only makes contact with the OVC 20 and gradient coil assembly 32 via the resilient pads 36 and may be considered mechanically unconstrained. In the case of a conventional, constrained, arrangement, the conductive shield 34 would be rigidly mechanically affixed in place with a glue or resin to the OVC 20 and/or the gradient coil assembly 32.

According to a feature of the present exemplary embodiment, the conductive shield 34 in the bore tube is unconstrained, at least in the sense of being mechanically weakly coupled to the OVC bore tube 24. The conductive shield accordingly has a range of relatively free movement relative to the gradient coil assembly 32 and OVC 24.

Experiments to measure the heat dissipation in cryogenically cooled components, including coils 10, a bore tube of inner thermal shield 22, shield support structure 26 and mechanical retaining structure 18, due to the excitation of a z-gradient coil with a current of 128 A peak-peak as a function of excitation frequency have been performed for various configurations of conductive shield. A significant portion of the results of these simulations are shows in FIG. 4. The experiments assume a structure such as shown in FIG. 2, but the details of the various dimensions and densities are not discussed herein, as it does not relate to the preferred embodiment. Other than the provision of the conductive shield 34 and its mounting structure, the magnet system is of conventional construction.

Simulations were performed for z-gradient excitations over the frequency range of 100 to 5000 Hz, but significant power dissipation in the cryogenically cooled parts of the simulated system occurred only in the illustrated frequency range of 3000 to 4800 Hz. The simulations were performed on a system with half the diameter of a typical clinical MRI scanner. Similar effects will occur in a typical clinical MRI scanner at half the frequencies quoted here, because the effects are determined by the mechanical resonance frequencies, which are inversely proportional to the diameter of the system.

Figure 4:
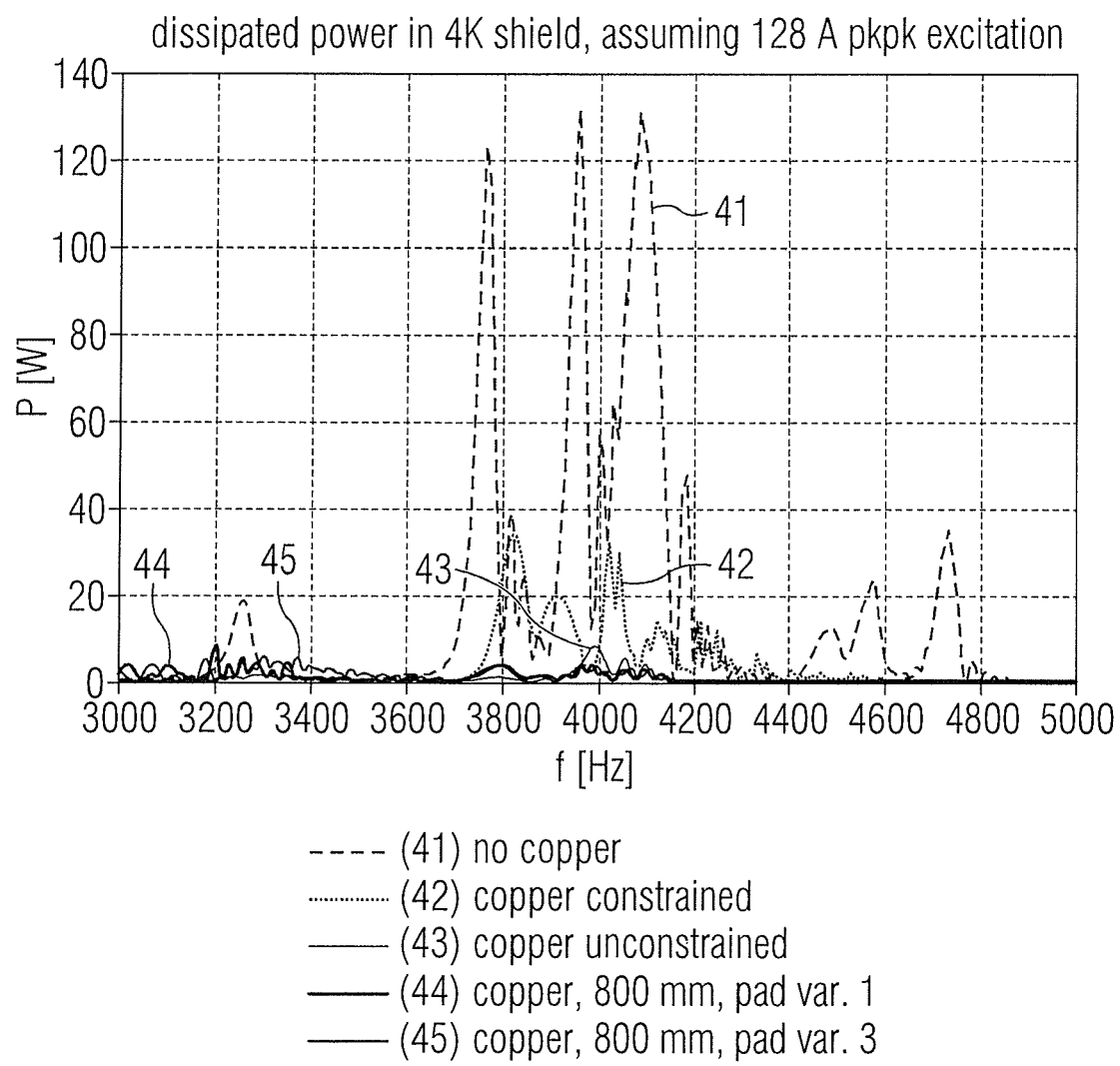
FIG. 4 shows examples of heat dissipation in cryogenically cooled components due to the excitation of a z-gradient coil as a function of excitation frequency.

The simulated power dissipation curves shown in FIG. 4 represent the following situations:

41—no copper—represents a simulation of the arrangement of FIG. 1, in which no conductive shield is provided, as a reference for comparison of the effectiveness of shielding of various configurations of conductive shield;

42—copper constrained—represents an arrangement, not according to the present invention, in which a copper conductive shield 34 is provided, mechanically bonded to the OVC bore tube 24;

43—copper unconstrained—represents a copper conductive shield 34 which is free to move, as if in a state of zero gravity. Obviously, this is a theoretical simulation, since any practical arrangement will require the conductive shield to be supported against gravity and restrained in position within the bore of the magnet system, which will necessarily involve some degree of constraint to the movement of the conductive shield;

44—copper, 800 mm pad var 1—represents a first configuration in which a mechanically resilient, damping mounting structure such as foam pads, such as of SYLOMER® Pink, is provided between the OVC bore tube 20 and the conductive shield 34, to support the conductive shield against gravity and retain it in position within the bore of the OVC; and 45—copper, 800 mm pad var 2—represents a second configuration in which a mechanically resilient, damping mounting structure such as foam pads, such as of SYLOMER® Pink, is provided between the OVC bore tube 20 and the conductive shield 34, to support the conductive shield against gravity and retain it in position within the bore of the OVC.

The first configuration 44 and the second configuration 45 differ in the damping constants of the pads used.

As can be clearly seen from FIG. 4, even the conventional constrained conductive shield represented by curve 42 provides a considerable reduction in power dissipated in the cryogenically cooled components as compared to the unshielded case illustrated at 41.

However, a far greater reduction in power dissipated in the cryogenically cooled components is provided by the unconstrained conductive shield as represented by curve 43 in FIG. 4. As mentioned above, it is not a practical prospect to provide a truly unconstrained conductive shield.

Examples of possible practical implementations of the present preferred embodiment are shown by curves 44 and 45 which represent conductive shields retained by examples of resilient damping mounting structures. Surprisingly, the inventors have shown by simulation that the reduction in power dissipated in the cryogenically cooled components is even greater for these conductive shields retained by resilient damping mounting structures than for the theoretical, unconstrained conductive tube represented by curve 43.

Figure 5:
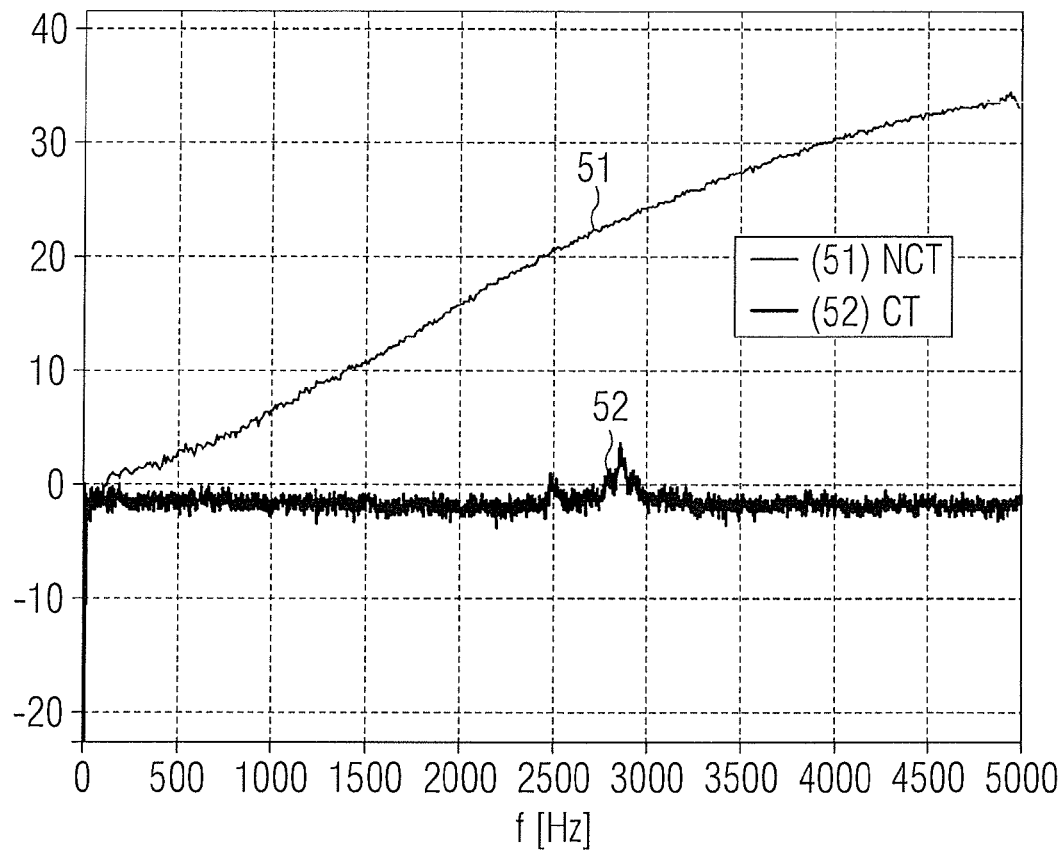
FIG. 5 shows experimental data for normalized power dissipated in the magnet coils 10 with an echo planar imaging (EPI) signal.

FIG. 5 shows experimental data for normalized power dissipated in the magnet coils 10 with an echo planar imaging (EPI) signal, itself discussed in more detail below, normalised to a maximum peak-to peak field through a range of frequencies of 0-5000 Hz, where the amplitude is independent of the frequency. For the purpose of this experiment, a cylindrical magnet structure such as shown in FIGS. 1 and 2 was used, but the bore tubes of the OVC 20 and thermal radiation shields 22, 24 are of an electrically and magnetically transparent material such as glass reinforced plastic, GRP. In such an arrangement, which does not represent a practical proposition, the absence of conducting layers between the gradient coil assembly and the superconducting coils mean that a large power is dissipated in the magnetic coils, as illustrated by curve 51 in FIG. 5. If such a system were operated at maximum current, the magnet would have quenched at all frequencies above about 230 Hz. Curve 52 in FIG. 5 shows corresponding data for power dissipation in the superconducting coils for the structure just described, but in which a copper unconstrained conductive shield according to the present preferred exemplary embodiment has been added.

As shown in FIG. 5, a remarkable reduction of power dissipated in the superconducting coils results from the addition of a conductive shield of the present embodiment. In the experiment of which the results are shown in curve 52, the conductive shield of the present embodiment is the only electrically conductive surface between the gradient coil assembly and the superconducting coils, and the reduction in power dissipated in the superconducting coils can clearly be attributed to the addition of the conductive shield of the present embodiment. In a real application, other conductive layers will be present between the gradient coil assembly and the superconducting coils, so the reduction in dissipated power due to the addition of the conductive shield will not have such a profound effect.

A possible disadvantage of the proposed unconstrained, or resiliently mounted, conductive shield is the possible increase of acoustic noise due to mechanical vibrations of the conductive shield.

Due to the required imaging speed, the magnetic field of the gradient coils is required to oscillate at a frequency within the audible range, and the present invention requires the conductive shield to be able to oscillate. It is accordingly inappropriate to attempt to mitigate the problem of added acoustic noise by attempting to restrain the mechanical vibration of the conductive shield.

However, in certain embodiments of the present invention, the following mitigating measures may be employed:

The gap between the conductive shield 34 and the OVC bore tube 20 as well as the gap between the gradient coil assembly 32 and the conductive shield 34 may be sealed at its axial ends with a compliant seal such as an O ring seal, or a pneumatic or hydropneumatic seal, being an inflatable annular chamber which is positioned in the gap to be sealed, and inflated with air or water (or other fluid as appropriate) to form a seal.

The gap between the conductive shield 34 and the OVC bore tube 20 as well as the gap between the gradient coil assembly 32 and the conductive shield 34 may be sealed at its axial ends with a soft, compliant, material, such as Silcoset™ sealant available from Akzo Nobel N.V.

In either of these variants, the gaps may be evacuated before being sealed to reduce the transmission of acoustic noise within the gap.

In a more extreme variant, the whole of the gap between the conductive shield 34 and the OVC bore tube 20 as well as the gap between the gradient coil assembly 32 and the conductive shield 34 may be filled with a soft, compliant, material, such as Silcoset™ sealant available from Akzo Nobel N.V.

In another approach to reducing the transmission of acoustic noise from the conductive shield and according to a different embodiment of the invention, the conductive shield 34 is positioned within the OVC, radially outside the OVC bore tube shown at 20 in FIGS. 1 and 2.

Figure 6:
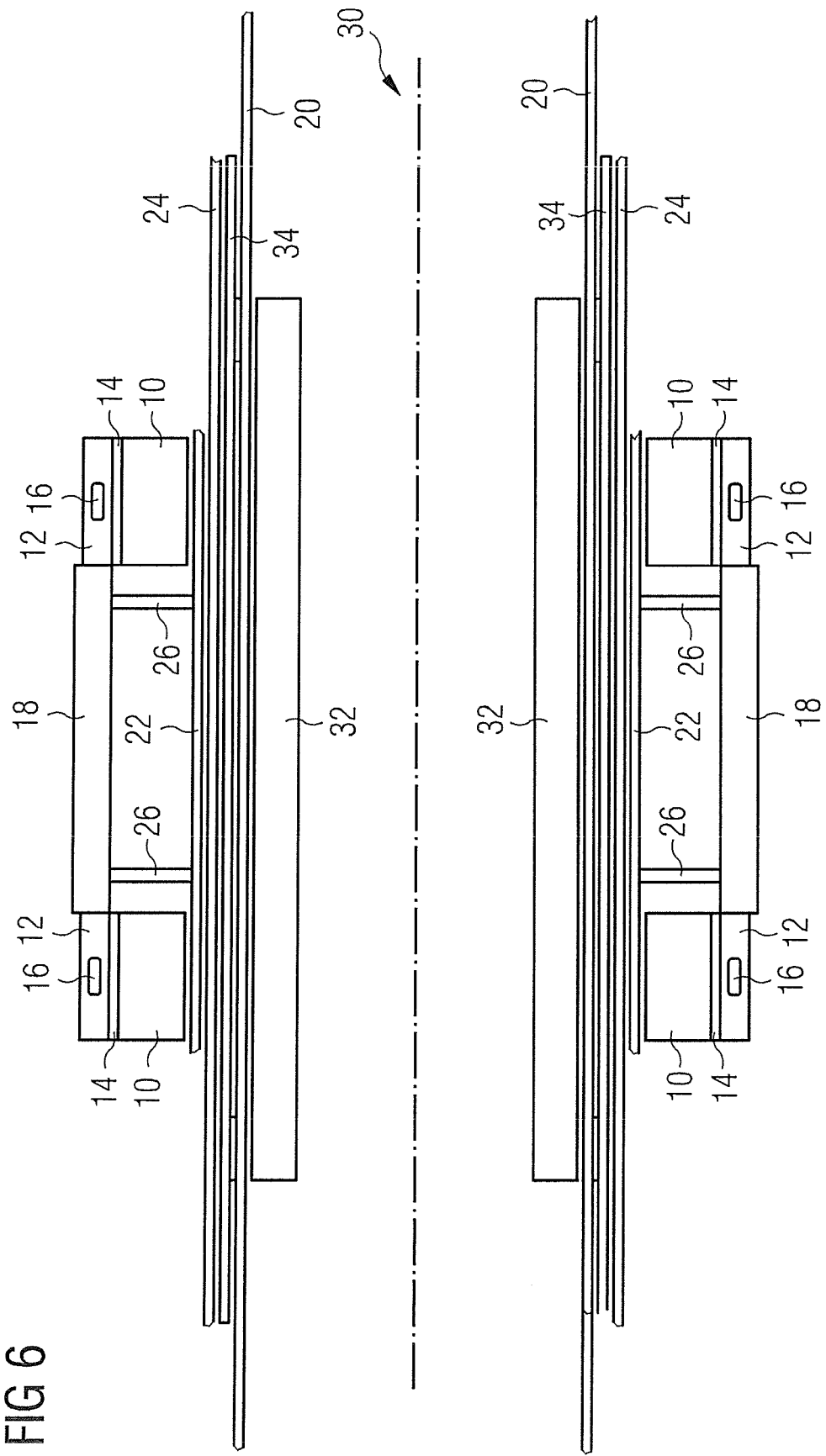
FIG. 6 shows a schematic axial part-cross-section of the MRI system of FIG. 1, improved according to another exemplary embodiment of the present invention.

FIG. 6 illustrates such an embodiment. In order to accommodate the conductive shield 34 within the OVC, the OVC bore tube is reduced in diameter. The conductive shield is mounted on flexible resilient mounting blocks 36 in the gap between the conductive shield and the OVC bore tube; but not between the conductive shield and the thermal radiation shield 24. In such an embodiment, the conductive shield oscillates within the vacuum space between the OVC 20 bore tube and the thermal shield 24 bore tube, and cannot generate significant acoustic noise within the bore of the MRI system.

Table 1 shows a summary of the key findings of experiments performed to investigate the effectiveness of a conductive shield according to the present exemplary embodiment when certain oscillating electric currents are applied to an example z-gradient coil.

Table 1 represents an experiment of an echo planar imaging (EPI) signal applied to the z-gradient coils. This signal includes a repetitive cycle of a period of zero current and a period of a certain current—in this example, a current of about 10% of maximum current—with the current following a linear ramp over a certain rise time (RT) between the two current values. In the upper part of table 1, this linear ramp is operated with a rise time (RT) of 1 μs, while the lower part of table 1 represents results of a similar signal operated with a rise time (RT) of 100 μs.

Data is provided representing an embodiment of the invention in which a conductive shield is provided in the form of a copper tube (CT) as described above in relation to FIG. 2. Data is also provided, for comparison purposes, for a similar magnet system which is not provided with a conductive shield, as described above in relation to FIG. 1.

Data are provided for a range of frequencies of EPI signal applied to the z-gradient coils: 1 kHz, 1.33 kHz and 4 kHz.

In each case, data is provided representing the change in temperature of the inner thermal shield 22 (ΔT(K)) and the power dissipated within the inner thermal shield 22 (P(mW)).

Two entries for power dissipated are shown in bold and underlined. In those cases, the simulated superconducting coils quenched as a result of the dissipated heat.

The column headed "k", indicates the factor by which the dissipated power in the inner thermal shield is reduced by addition of the conductive shield of the present embodiment. As can be seen, a reduction on the dissipated power by a factor k of up to 17.8 was indicated in the experiments, and quench events which occurred without a conductive shield (NCT) did not occur in the presence of the conductive shield (CT). Rather, only a modest temperature rise of 0.291-1.775 K was observed.

The results in table 1 show that under all conditions there is a substantial reduction in the power dissipated in the inner shield 22, and the resulting temperature rise, when a conductive shield according to the present embodiment is included.

Accordingly, the present embodiment provides a modification to superconducting electromagnet systems such as those used in MRI imaging systems, the modification comprising the addition of a conductive shield between cryogenically cooled equipment and a gradient coil assembly, in which the conductive shield is unconstrained, or weakly constrained by mounting on a resilient, damping mounting structure. The conductive shield may be positioned either radially inside the bore tube of the OVC 20, between the OVC bore tube and the gradient coil assembly, or radially outside the OVC bore tube, within the OVC and between the bore tube of the OVC and the cryogenically cooled equipment.

The proposed conductive shield 34 consists of a complete cylinder of a material with high electrical conductivity, which is mounted in the bore of the magnet or OVC, such that the conductive shield is not strongly mechanically coupled to the OVC or the gradient coil and is regarded as unconstrained, being free to move within a certain range.

The present embodiment proposes the use of resilient damping mounts, which may be used to provide minimal mechanical contact between the conductive shield and the remainder of the magnet system, allowing relatively free oscillation of the conductive shield, while allowing mechanical coupling to be damped out.

The inclusion of this conductive shield provides more efficient thermal shielding and reduces the heat loads reaching temperature sensitive, cryogenically cooled, parts of the MRI system due to gradient coil induced heating.

The exemplary embodiment is of particular interest for 'dry' contact cooled magnets—those cooled without liquid cryogen—and those cooled with a small cryogen inventory, such as using a closed loop cooling system as described with reference to FIGS. 1 and 2. This is because such systems are more sensitive to heat loads than more conventional arrangements in which the superconducting coils are partially immersed in a bath of liquid cryogen, as the bath of liquid cryogen ensures that the coils remain at approximately the boiling point of the cryogen. Use of the conductive shield of the present exemplary embodiment in such bath-cooled magnets still provides the advantage of reduced refrigerator power consumption and/or reduced consumption of cryogen.

While the present invention has been described with reference to a limited number of embodiments, numerous variants and modifications will be apparent to those skilled in the art. For example, although the exemplary embodiments have been described with reference to cylindrical conductive shields positioned within the bore of cylindrical superconducting magnets, it may be applied to superconducting magnets of other geometries, such as "open" magnets, "C-shaped" magnets and so on. The embodiments are applicable to all arrangements in which a source of oscillating magnetic field is provided in the vicinity of a cryogenically cooled superconducting magnet.

The particular examples described above include an electrically conductive shield embodied as a copper tube. Copper is considered to be a useful material in this application as it has high electrical conductivity, a high mass density to resist mechanical oscillation and a mechanical resonant frequency rather different from the resonant frequencies of stainless steel or aluminium—materials commonly used in the construction of OVCs, and thermal radiation shields. Nevertheless, the conductive shields of the present embodiments may be constructed of other materials such as aluminium, or composite materials comprising metal and a plastic, provided that an appropriate electrical conductivity and mechanical resilience can be assured.

Although preferred exemplary embodiments are shown and described in detail in the drawings and in the preceding specification, they should be viewed as purely exemplary and not as limiting the invention. It is noted that only preferred exemplary embodiments are shown and described, and all variations and modifications that presently or in the future lie within the protective scope of the invention should be protected.

We claim as our invention:

1. A superconducting electromagnet system, comprising:
   cryogenically cooled magnet coils arranged to provide a static magnetic field in an imaging region;
   a gradient coil assembly arranged to provide oscillating magnetic fields within the imaging region;
   an electrically conductive shield positioned between the cryogenically cooled magnet coils and the gradient coil assembly;
   the cryogenically cooled magnet coils being located within an outer vacuum chamber, and the electrically conductive shield being positioned outside the outer vacuum chamber between a surface of the outer vacuum chamber and the gradient coil assembly and inside a bore tube of the outer vacuum chamber; and the conductive shield being supported on resilient damping mounts between the conductive shield and the gradient coil assembly and between the conductive shield and the bore tube of the outer vacuum chamber.

2. The system according to claim 1 wherein the resilient damping mounts comprise elastomer blocks positioned between a surface of the electrically conductive shield and a surface of an adjacent component of the system.

3. The system according to claim 1 further comprising a first thermal radiation shield positioned between the cryogenically cooled magnet coils and the outer vacuum chamber.

4. The system according to claim 3, wherein the first thermal radiation shield is in thermally conductive contact with the cryogenically cooled magnet coils.

5. The system according to claim 4, wherein a second thermal radiation shield is provided, and is positioned between the first thermal radiation shield and the outer vacuum chamber.

6. The system according to claim 1 in which each of the cryogenically cooled magnet coils is annular, and are axially aligned; and the gradient coil assembly and the electrically conductive shield are cylindrical, and are both located within a bore of the cryogenically cooled magnet coils.

7. The system according to claim 1 wherein the cryogenically cooled magnet coils are cooled by thermal conduction to a cryogenic refrigerator.

8. The system according to claim 1 wherein the cryogenically cooled magnet coils are cooled by a closed loop cooling system in which a cryogen circulates through a pipe which is in thermal contact with the magnet coils.

9. The system according to claim 1 wherein the cryogenically cooled magnet coils are cooled by partial immersion in a bath of cryogen.

10. The system according to claim 1 wherein the electrically conductive shield is formed of copper.

11. The system according to claim 1 wherein a gap between the electrically conductive shield and the outer vacuum chamber is sealed by at least one resilient seal.

12. The system according to claim 1 wherein a gap between the electrically conductive shield and the gradient coil assembly is sealed by at least one resilient seal.

13. The system according to claim 11 wherein the sealed gap is evacuated.

14. The system according to claim 11 wherein the sealed gap is filled with a resilient material.

15. The system according to claim 11 wherein the at least one resilient seal comprises pneumatic or a hydropneumatic seal.

16. The system according to claim 11 wherein the at least one seal comprises an o-ring seal.

17. A superconducting electromagnet system, comprising:
cryogenically cooled magnet coils arranged to provide a static magnetic field in an imaging region;
a gradient coil assembly arranged to provide oscillating magnetic fields within the imaging region;
an electrically conductive shield positioned between the cryogenically cooled magnet coils and the gradient coil assembly;
the cryogenically cooled magnet coils being located within an outer vacuum chamber, and the electrically conductive shield being positioned inside a bore tube of the outer vacuum chamber between a surface of the outer vacuum chamber and the cryogenically cooled magnet coils; and
the conductive shield being supported on resilient damping mounts between the conductive shield and the bore tube of the outer vacuum chamber.

18. The system according to claim 17 wherein the resilient damping mounts comprise elastomer blocks positioned between a surface of the electrically conductive shield and a surface of an adjacent component of the system.

19. The system according to claim 17 further comprising a first thermal radiation shield positioned between the cryogenically cooled magnet coils and the electrically conductive shield.

20. The system according to claim 19, wherein the first thermal radiation shield is in thermally conductive contact with the cryogenically cooled magnet coils.

21. The system according to claim 19, wherein a second thermal radiation shield is provided, which is positioned between the first thermal radiation shield and the electrically conductive shield.

22. The system according to claim 17, in which each of the cryogenically cooled magnet coils is annular, and are axially aligned; and the gradient coil assembly and the electrically conductive shield are cylindrical, and are both located within a bore of the cryogenically cooled magnet coils.

23. The system according to claim 17, wherein the cryogenically cooled magnet coils are cooled by thermal conduction to a cryogenic refrigerator.

24. The system according to claim 17, wherein the cryogenically cooled magnet coils are cooled by a closed loop cooling system in which a cryogen circulates through a pipe which is in thermal contact with the magnet coils.

25. The system according to claim 17, wherein the cryogenically cooled magnet coils are cooled by partial immersion in a bath of cryogen.

26. The system according to claim 17, wherein the electrically conductive shield is formed of copper.

27. The system according to claim 17, wherein a gap between the electrically conductive shield and the outer vacuum chamber is sealed by at least one resilient seal.

28. The system according to claim 17, wherein a gap between the electrically conductive shield and the gradient coil assembly is sealed by at least one resilient seal.

29. The system according to claim 27, wherein the sealed gap is evacuated.

30. The system according to claim 27, wherein the sealed gap is filled with a resilient material.

31. The system according to claim 27, wherein the at least one resilient seal comprises pneumatic or a hydropneumatic seal.

32. The system according to claim 27, wherein the at least one seal comprises an o-ring seal.

* * * * *